(12) United States Patent
Ji et al.

(10) Patent No.: US 11,380,368 B2
(45) Date of Patent: Jul. 5, 2022

(54) CHIPS AND ELECTRONICS DEVICES

(71) Applicant: ChangXin Memory Technologies, Inc., Hefei (CN)

(72) Inventors: KangLing Ji, Hefei (CN); Hongwen Li, Hefei (CN); Kai Tian, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/055,028

(22) PCT Filed: Dec. 11, 2019

(86) PCT No.: PCT/CN2019/124626
§ 371 (c)(1),
(2) Date: Nov. 12, 2020

(87) PCT Pub. No.: WO2021/036094
PCT Pub. Date: Mar. 4, 2021

(65) Prior Publication Data
US 2021/0375328 A1    Dec. 2, 2021

(30) Foreign Application Priority Data
Aug. 26, 2019   (CN) .......................... 201910788328.7

(51) Int. Cl.
*G11C 5/02*     (2006.01)
*G11C 5/06*     (2006.01)
*G11C 11/406*   (2006.01)

(52) U.S. Cl.
CPC .............. *G11C 5/025* (2013.01); *G11C 5/06* (2013.01); *G11C 11/406* (2013.01)

(58) Field of Classification Search
CPC .................................. G11C 5/025; G11C 5/06
(Continued)

(56) References Cited

U.S. PATENT DOCUMENTS 5,742,551 A   4/1998 Yukutake et al.
5,867,446 A   2/1999 Konishi et al.
(Continued)

FOREIGN PATENT DOCUMENTS

CN    1158178 A     8/1997
CN    210156118 U   3/2020
(Continued)

OTHER PUBLICATIONS

PCT/CN2019/124626 International Search Report dated May 26, 2020.

*Primary Examiner* — Connie C Yoha
(74) *Attorney, Agent, or Firm* — Alston & Bird LLP (57) ABSTRACT

The disclosed chip includes a storage module, pins, a control module, a first connection and a second connection. The storage module includes a first and a second storage array groups, which respectively include a plurality of first storage arrays and a plurality of second storage arrays. The pins are located on the side of the first storage array group away from the second storage array group. The control module is located between the first storage array group and the second storage array group. The first connection pin connects to the control module; and the second connection connects the control module to the first and the second storage array groups. The first connection line has a length less than the distance from the control module to the second storage array group at far side of the control module. The chip reduces the parasitic capacitance introduced by the first connection.

12 Claims, 7 Drawing Sheets

(58) Field of Classification Search
USPC .................................................... 365/63, 51
See application file for complete search history.

(56) References Cited

U.S. PATENT DOCUMENTS

| | | | | |
|---|---|---|---|---|
| 7,440,289 | B2* | 10/2008 | Sugano | G11C 5/00 |
| | | | | 361/760 |
| 8,417,870 | B2* | 4/2013 | Lee | G11C 5/04 |
| | | | | 711/5 |
| 8,422,263 | B2* | 4/2013 | Saito | G11C 7/1087 |
| | | | | 365/63 |
| 2002/0145923 | A1 | 10/2002 | Dietrich et al. | |
| 2007/0127304 | A1* | 6/2007 | Yoon | G11C 5/04 |
| | | | | 365/230.01 |

FOREIGN PATENT DOCUMENTS

| | | | |
|---|---|---|---|
| JP | 0922990 | A | 1/1997 |
| WO | WO 2021/036094 | A1 | 3/2021 |

* cited by examiner

CHIPS AND ELECTRONICS DEVICES

CROSS REFERENCES TO RELATED APPLICATIONS

This application is a national phase entry of International Application No. PCT/CN2019/124626, filed on Dec. 11, 2019, which claims the benefit of priority to CN Patent Application CN201910788328.7, filed on Aug. 26, 2019, both entitled CHIPS AND ELECTRONICS DEVICES", the contents of which are incorporated herein by reference in its entirety.

TECHNICAL FIELD

This application relates to the field of semiconductors, and in particular to a chip and an electronic device having the chip.

BACKGROUND

To achieve a high-speed and low-power chip layout is a very important step in the design of DRAM (Dynamic Random Access Memory) in addition to meeting the current packaging requirements. The existing packaging of some of the DRAM chips requires that the pins of the chip be on one side of the chip, usually on the short side of the chip. Such a chip layout adversely affects the performance of the chip. Instructions need to enter from the side of the chip pins, after being decoded, they are transmitted to the side of the chip storage array to operate the storage array. Data obtained from the storage array needs to transmit across the entire chip to the side where the pins are located. This slows down chip operation, and the chip power consumption is relatively large from the long-distance transmission of large amounts of data.

To solve the above problem, designers introduced a layer of top-level wiring. The transmission speed of this layer of wiring is faster. Through the introduction of this layer of wiring, pin-related circuits and chip control circuits can be set to the middle section of the chip, then the pin-related circuits and chip control circuits can be connected to external pins through the disposed quick connection. This layout allows instructions entered through the pins to quickly reach the middle section of the chip, and data returned from the storage array needs only to transmit to the pin-related circuits and control circuits in the middle of the chip, and then such data is transmitted through the disposed top-level connection to the external pins of the chip. This chip layout has significantly improved transmission speed, chip power consumption and power distribution inside the chip. However, as chip capacity increases, the length of the top-level wiring also increases, causing the additional parasitic capacitance to insert a greater impact on the transmission of high-speed signals, to the point that the eye diagram may be closed.

It should be noted that the information disclosed in the above background section is only meant to enhance the understanding of the background of the present disclosure, and therefore should not constitute any known knowledge to those of ordinary skill in the art.

SUMMARY

The present disclosure provides a chip and an electronic device, thereby to some extent overcome or improve the problems of large parasitic capacitance or low transmission speed in the existing top-level wiring.

Other characteristics and advantages of the present disclosure will become apparent through the following detailed description, or through the practicing the present disclosure.

According to the first aspect of the present disclosure, a chip is provided which includes a storage module, wherein the storage module comprises a first storage array group and a second storage array group, wherein the first storage array group comprises a plurality of first storage arrays and the second storage array group comprises a plurality of second storage arrays; pins located on a side of the first storage array group away from the second storage array group; a control module located between the first storage array group and the second storage array group; a first connection electrically connecting the pins and the control module; and a second connection electrically connecting the control module with the first storage array group and the second storage array group; wherein a length of the first connection is less than a distance from the control module to a side of the second storage array group away from the control module.

In one embodiment, the control module includes a control circuit and a pin circuit.

In one embodiment, the first connection comprises a command address line and a data line, and the second connection comprises a command address bus and a data bus.

In an embodiment, the ratio of the number of the plurality of first storage arrays in the first storage array group to the number of the plurality of second storage arrays in the second storage array group ranges from 1/5 to 1/3.

In one embodiment, the ratio of the number of the plurality of first storage arrays in the first storage array group to the number of the plurality of second storage arrays in the second storage array group is 1/3.

In an embodiment, the ratio of the number of the plurality of first storage arrays in the first storage array group to the number of the plurality of second storage arrays in the second storage array group is 1/5.

In an embodiment, the ratio of the number of the plurality of first storage arrays in the first storage array group to the number of the plurality of second storage arrays in the second storage array group is 1/2.

In an embodiment, the control module is located between two adjacent sides of the first storage array group and the second storage array group.

In one embodiment, the storage module further comprises a third storage array group, wherein the third storage array group comprises a plurality of third storage arrays, and wherein the control module comprises a third side and a four side; and the plurality of third storage arrays in the third storage array group is located on the third side or the fourth side of the control module.

In one embodiment, the storage module further includes a third storage array group, the third storage array group includes a plurality of storage arrays, and the control module includes a third side and a fourth side; the storage arrays included in the third storage array group are respectively located on the third side and the fourth side of the control module.

In one embodiment, the first connection is a top-level wire, and wherein the first connection communicatively connects to the pins and to the control module.

In one embodiment, the storage module is rectangular, and the pins are located on one of the two short sides of the rectangle.

The present disclosure has the following benefits: by improving the layout of the control circuit and the pin circuit, the present disclosure reduces the parasitic capacitance introduced by the top-level wiring, reduces the adverse effect of the parasitic capacitance on the chip, and improves the operating speed of the chip to a certain extent.

It should be understood that the above general description and the following detailed description are only exemplary and explanatory, thus cannot limit the present disclosure.

BRIEF DESCRIPTION OF THE DRAWINGS

The drawings herein are incorporated into the specification and constitute a part of the specification, show embodiments in accordance with the disclosure, and together with the specification are used to explain the principle of the disclosure. Obviously, the drawings in the following description are only some embodiments of the present disclosure. For those of ordinary skill in the art, other drawings can be obtained based on these drawings without creative work.

DETAILED DESCRIPTION OF THE PREFERRED EMBODIMENTS

Exemplary embodiments will now be described more fully with reference to the accompanying drawings. However, the exemplary embodiments can be implemented in various forms, and should not be construed as being limited to the embodiments set forth herein; on the contrary, these embodiments are provided so that this disclosure will be comprehensively, completely, and fully convey the concept of the exemplary embodiments to those skilled in the art. In the figures, the same reference numerals denote the same or similar parts, and thus their repeated description will be omitted.

Furthermore, the described features, structures or characteristics may be combined in one or more embodiments in any suitable manner. In the following description, many specific details are provided to give a sufficient understanding of the embodiments of the present disclosure. However, those skilled in the art will realize that the technical solutions of the present disclosure can be practiced without one or more of the specific details, or other methods, components, devices, steps, etc. can be used. In other cases, well-known methods, devices, implementations or operations are not shown or described in detail to avoid obscuring aspects of the present disclosure.

The block diagrams shown in the drawings are merely functional entities, and do not necessarily correspond to physically independent entities. That is, these functional entities can be implemented in the form of software, or implemented in one or more hardware modules or integrated circuits, or implemented in different networks and/or processor devices and/or microcontroller devices entity.

The flowchart shown in the drawings is only an exemplary description, and does not necessarily include all contents and operations/steps, nor does it have to be performed in the described order. For example, some operations/steps can be decomposed, and some operations/steps can be combined or partially combined, so the actual execution order may be changed according to actual conditions.

It should be understood that although the terms first, second, third, etc. may be used herein to describe various components, these components should not be limited by these terms. These terms are used to distinguish one component from another. Therefore, the first component discussed below may be referred to as the second component without departing from the teaching of the concepts of the present disclosure. As used herein, the term "and/or" includes any one and all combinations of one or more of the associated listed items.

Those skilled in the art can understand that the accompanying drawings are only schematic diagrams of exemplary embodiments, and the modules or processes in the accompanying drawings are not necessarily necessary for implementing the present disclosure, and therefore cannot be used to limit the protection scope of the present disclosure.

Figure 1:
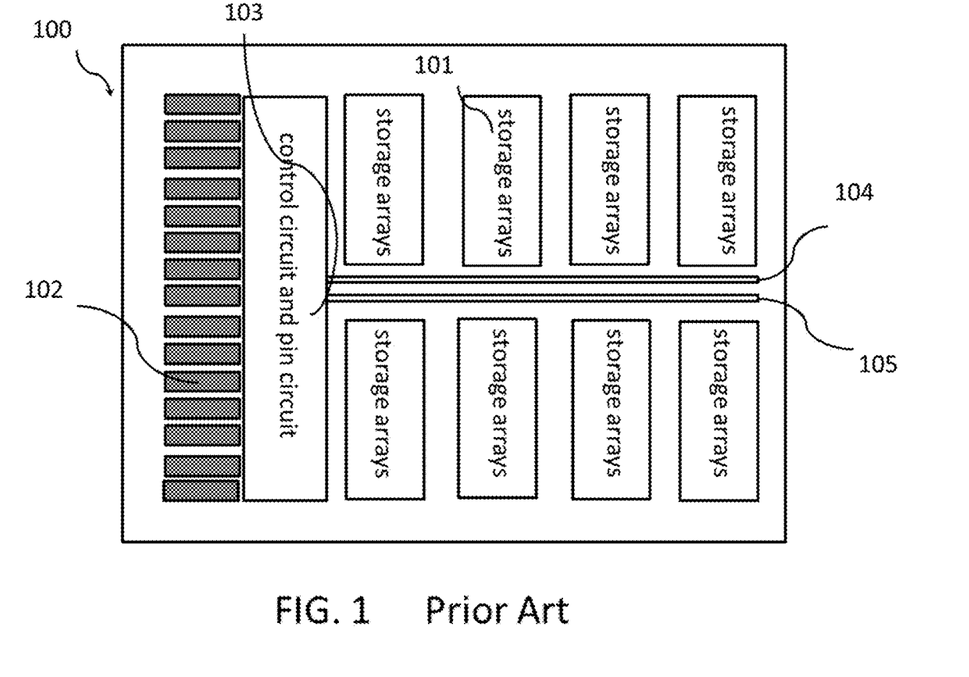
FIG. 1 is a schematic diagram of a chip layout in a related art.

FIG. 1 is a schematic diagram of the chip layout 100 in the related art.

As shown in FIG. 1 chip 100 of a related art includes a storage module (including multiple storage arrays 101), pins 102, a control module 103 (control circuit and pin circuit), and a second connection (command address bus 104 and data bus 105). Here the pins 102 are communicatively connected with the control circuit and the pin circuit 103. As a well-known technology in the art, and this connection will not be described here. The control circuit and pin circuit 103 are in communicative connections with a plurality of storage arrays 101 through a command address bus 104 and a data bus 105, where the control circuit and pin circuit 103 are connected to the command address bus 104 and the data bus 105, and the command address bus 104 the connection with the data bus 105 and the multiple storage arrays 101 are a well-known technology in the art, so will not be described here. The instruction address bus 104 is shown as one line in FIG. 1. In other embodiments, the instruction address bus 104 may be two separate lines (instruction bus and address bus). In FIG. 1, the instruction address bus 104 and the data bus 105 are shown as two separate lines. In other embodiments, the instruction address bus 104 and the data bus 105 may be combined into one line.

Referring to FIG. 1, when the pins 102 receive an operation instruction, after decoding by the control circuit and the pin circuit 103, the instruction is transmitted to one side of the multiple storage arrays 101 through the instruction address bus 104, thereby the storage array 101 operates. After the instruction is transmitted to the multiple storage arrays 101 through the instruction address bus 104, data obtained from the multiple storage arrays 101 needs to be transmitted to the control circuit and the pin circuit 103 through the data bus 105, and then the data is transmitted out through the pins 102.

The chip layout in FIG. 1 provides slow reading and storage speeds in the chip and high power consumption as the result of the long-distance transmission of both instructions and data.

Figure 2:
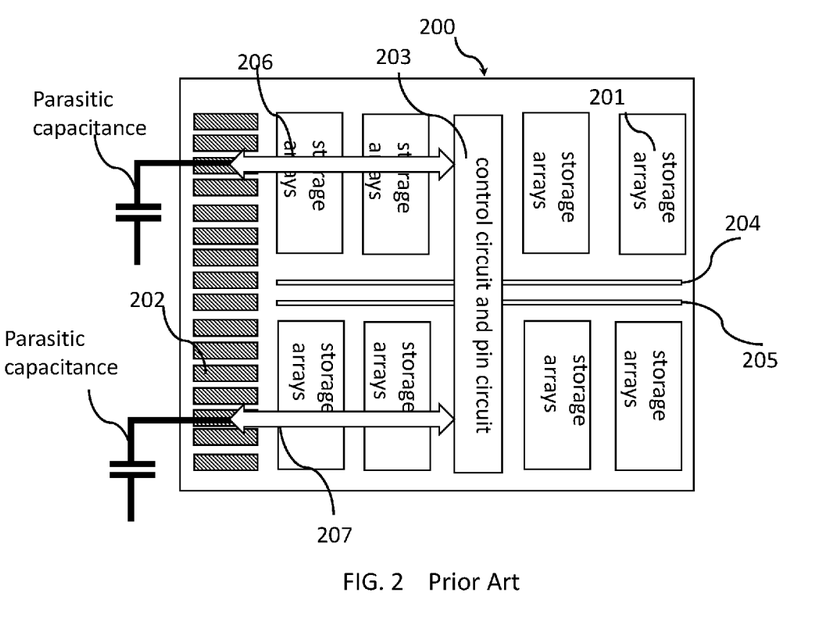
FIG. 2 is a schematic diagram of a chip layout in a related art.

FIG. 2 is a schematic diagram of the chip layout 200 in the related art.

As shown in FIG. 2, chip 200 in the related art includes a storage module (including multiple storage arrays 201), pins 202, a control module 203 (control circuit and pin circuit), and a second connection (command address bus 204 and data bus 205) and the first connections (command address connection line 206 and data connection line 207). Among them, the command address connection line 206 and the data connection line 207 have parasitic capacitance. The parasitic capacitance is caused by the wiring of the command address connection line 206 and the data connection line 207 hung over the oxide layer. The capacitance symbol used in FIG. 2 represents that the command address line 206 and the data line 207 produced parasitic capacitance.

Referring to FIG. 2, pins 202 are communicatively connected with the control circuit and the pin circuit 203 through the command address connection line 206 and the data connection line 207. The connections are well-known technology in the art so it will not be described here. The control circuit and pin circuit 203 are in communicative connection with a plurality of storage arrays 201 through a command address bus 204 and a data bus 205, wherein the control circuit and pin circuit 203 are connected to the command address bus 204 and the data bus 205. The connection between the data bus 205 and the multiple storage arrays 201 belongs to a well-known technology in the art, so it will not be described here. Herein, the command address bus 204 is shown as one line in FIG. 2, but in other embodiments, the command address bus 204 may be two separate lines. In FIG. 2, the command address bus 204 and the data bus 205 are shown as two separate lines. In other embodiments, the command address bus 204 and the data bus 205 may be one line.

Referring to FIG. 2, a plurality of storage arrays 201 are provided on both sides of the control circuit and the pin circuit 203, and the number of storage arrays 201 provided on both sides of the control circuit and the pin circuit 203 is equal (both are 4). The control circuit and the pin circuit 203 are connected to the pins 202 through a command address connection line 206 and a data connection line 207. The command address connection line 206 and the data connection line 207 are both top-level connections on the chip. The wiring is arranged on the top layer of the chip, so compared to other metal layers on the chip, the width and thickness of the top layer wiring are relatively large. The larger width and thickness result in lower top wiring resistance, therefore, the top layer wiring has a faster transmission speed and lower power loss, realizing a high-speed data transmission between the control circuit and the pin circuit 203 and the pins 202.

Referring still to FIG. 2, when the pins 202 receive an operation instruction, the instruction is transmitted to the control circuit and the pin circuit 203 through the instruction address connection line 206, and the instruction is decoded by the control circuit and the pin circuit 203. The instruction address bus 204 transfers the instruction to the multiple storage arrays 201, and the multiple storage arrays 201 are then operated. After the instruction is transmitted to the multiple storage arrays 101 through the instruction address bus 204, data obtained from the multiple storage arrays 201 is transmitted to the control circuit and the pin circuit 203 through the data bus 205, and then the data continues to transmit through the data connection line 207 to the pins 202 as data output.

In the layout of the chip 200 in FIG. 2, the control circuit and the pin circuit 203 are arranged in the middle of a plurality of storage arrays 201 (the numbers of storage arrays 201 arranged on both sides of the control circuit and the pin circuit 203 are equal), the control circuit and the pin circuit 203 is connected to the pins 202 through the command address line 206 and the data line 207. Because the control circuit and the pin circuit 203 are arranged in the middle of the multiple storage arrays 201, the speed of the commands sent by the control circuit and the pin circuit 203 to the storage array 201 and the speed of acquiring data from the storage array 201 have been greatly improved, resulting in faster reading and storage speed by chip 200, at the same time, its power consumption drops. However, due to adding the command address connection line 206 and the data connection line 207 between the control circuit and the pin circuit 203 and the pins 202, new parasitic capacitance is introduced into the chip 200. The added parasitic capacitance affects the signal and data transmission of the chip. The transmission causes adverse effects and even closes the eye diagram.

Figure 3:
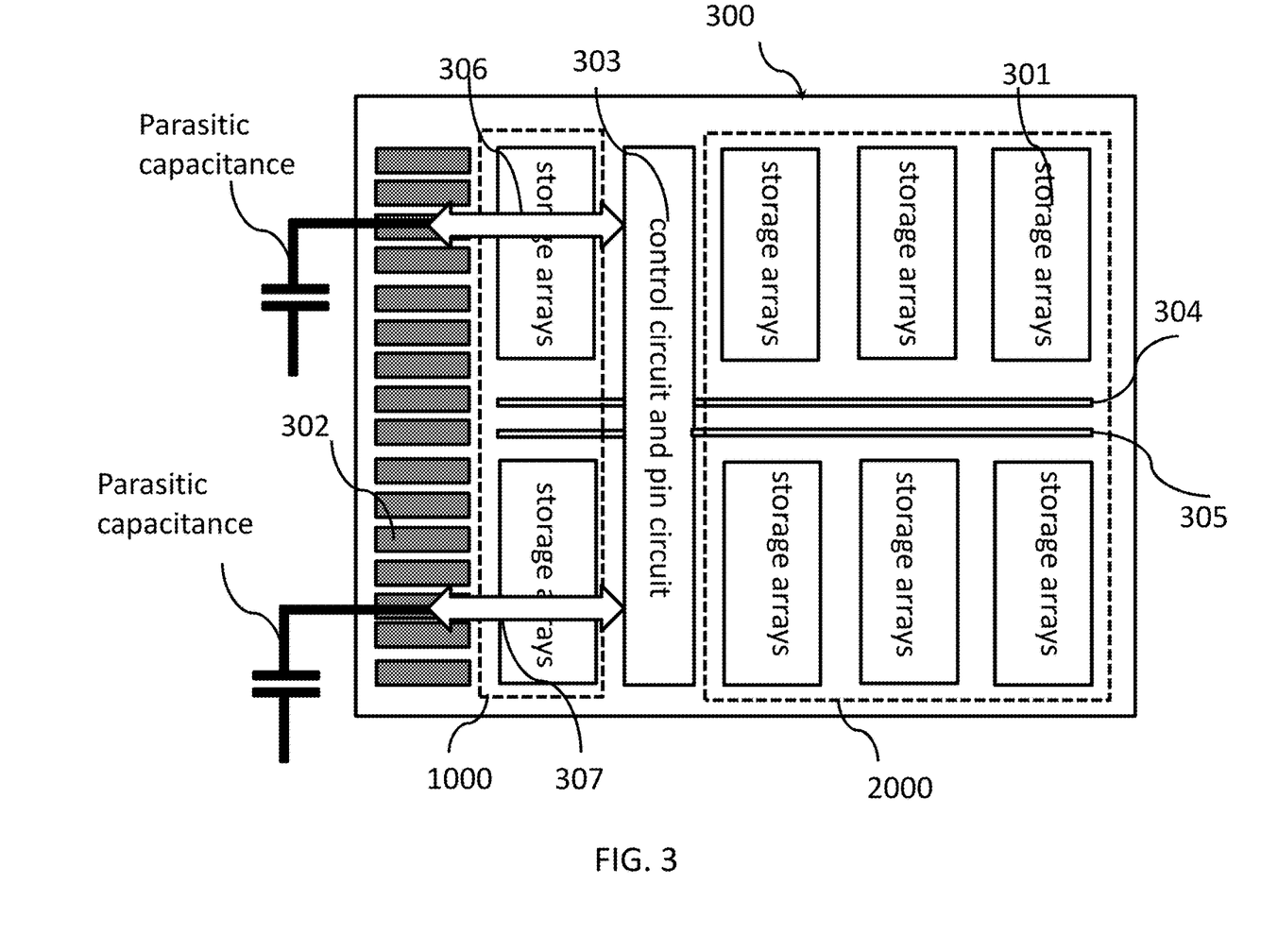
FIG. 3 is a schematic diagram of a chip layout according to an embodiment of the present disclosure.

FIG. 3 is a schematic diagram of the structural layout of a chip 300 according to an embodiment of the present disclosure.

As shown in FIG. 3, the chip 300 of the present disclosure includes storage modules (including a first storage array group 1000 and a second storage array group 2000. The first storage array group 1000 and the second storage array group 2000 respectively include multiple storage array 301), pins 302, control module 303 (control circuit and pin circuit), the second connection (command address bus 304 and data bus 305) and the first connection (command address connection line 306 and data connection line 307). Among them, the command address line 306 and the data line 307 have parasitic capacitance. In the embodiment shown in FIG. 3, the first storage array group 1000 includes two storage arrays 301, and the second storage array group 2000 includes 6 storage arrays, but the present invention is not limited to these numbers, and the first storage array group 1000 may include storage arrays 301 other than two, the second storage array group 2000 may include storage arrays other than six.

Referring to FIG. 3, the ratio of the numbers of storage arrays 301 included in the first storage array group 1000 and the second storage array group 2000 is 1/3.

In one embodiment, the length of the first connection is less than the distance from the control module 303 to one end of the second storage array group 2000 away from the control module 303.

In one embodiment, the storage arrays included in the storage module are evenly arranged, so the ratio of the numbers of storage arrays can reflect the length relationship between the elements of the chip. That is, referring to FIG. 3, the ratio of the numbers of storage arrays 301 included in the first storage array group 1000 and the second storage array group 2000 is 1/3, which can also reflect the length of the first connection and the distance to from the control module 303 to the far side of the second storage array group 2000 is about 1/3 (the length of the first connection is smaller than the distance from the control module 303 to the far side of the second storage array in the group 2000).

Referring to FIG. 3, the pins 302 are communicatively connected with the control circuit and the pin circuit 303 through the command address connection line 306 and the data connection line 307. This connection is a well-known technology in the art so will not be described again here. The control circuit and pin circuit 303 are in communicative connection with a plurality of storage arrays 301 through a command address bus 304 and a data bus 305, wherein the control circuit and pin circuit 303 are connected to the command address bus 304 and the data bus 305 and the command address bus 304. The connection with the data bus 305 and the multiple storage arrays 301 belongs to a well-known technology in the art, thus will not be described here. The command address bus 304 is shown as one line in FIG. 3, but in other embodiments, the command address bus 304 may be two separate lines. In FIG. 3, the command address bus 304 and the data bus 305 are shown as two separate lines. In other embodiments, the command address bus 304 and the data bus 305 may combine into one line.

Referring to FIG. 3, the control circuit and the pin circuit 303 and the pins 302 are communicatively connected through the command address connection line 306 and the data connection line 307, where the command address connection line 306 and the data connection line 307 are both top-level wires. High-speed data transfer between the control circuit and the pin circuit 303 and the pins 302 can be realized.

Continue with referring to FIG. 3, when the pins 302 receive an operation instruction, the instruction is transmitted to the control circuit and the pin circuit 303 through the instruction address connection line 306, and the control circuit and the pin circuit 303 does decoding and other operations on the instruction which is then transferred to the multiple storage arrays 301 by the address bus 304 for proper operation. After the instruction is transmitted to the multiple storage arrays 301 through the instruction address bus 304, the data acquired from the multiple storage arrays 301 is transmitted to the control circuit and the pin circuit 303 through the data bus 305, and then the data is transmitted to the pins 302 through the data connection line 307 as the data output.

In the layout of the chip 300 in FIG. 3, the control circuit and the pin circuit 303 are arranged between the first storage array group 1000 and the second storage array group 2000 (the storage arrays arranged on both sides of the control circuit and the pin circuit 303 with the number ratio of 301 being 1/3), the control circuit and the pin circuit 303 are connected to the pins 302 through the command address connection line 306 and the data connection line 307. Because the control circuit and the pin circuit 303 are arranged in the middle of the multiple storage arrays 301, the speed of the instructions sent by the control circuit and the pin circuit 303 to the storage array 301 and the speed of acquiring data from the storage array 301 is much increased over that of the chip 100 shown in FIG. 1, thus improving reading and storage speed performance of the chip 300 relative to the chip layout of FIG. 1, and achieving a lower power consumption as well. Compared with the chip 200 shown in FIG. 2, the lengths of the command address connection line 306 and the data connection line 307 between the control circuit and the pin circuit 303 and the pins 302 are shorter than those of the command address connection line 206 and the data connection line 207, respectively, which reduces the parasitic capacitance introduced by the lines, thereby mitigates the adverse effect of the parasitic capacitance on the signal transmission speed of the chip 300 compared to the layout of FIG. 2. As explained above in addition, the transmission and reading speed of the chip 300 is improved over FIG. 1.

The ratio of the numbers of storage arrays of the first storage array group 1000 and the second storage array group 2000 shown in FIG. 3 is exemplary. The number of storage arrays 301 of the first storage array group 1000 is smaller than that of the second storage array group 2000. The number of storage arrays 301 in the first storage array group 1000 and the introduced parasitic capacitance are within the first threshold, so that the chip 300 can operate normally.

The first threshold refers to the maximum parasitic capacitance value that allows the chip to operate normally.

In an embodiment, the ratio of the numbers of storage arrays respectively included in the first storage array group 1000 and the second storage array group 2000 is greater than or equal to 1/5 and less than or equal to 1/3.

In one embodiment, referring also to FIG. 3, the control circuit and the pin circuit 303 are located in the middle between the adjacent sides of the first storage array group 1000 and the second storage array group 2000.

In one embodiment, referring also to FIG. 3, the first connection (command address connection line 306 and data connection line 307) is located on a different layer than all other layers of the chip 300, and is communicatively connected to the pins 302 and the control module 303.

In one embodiment, referring also to FIG. 3, the storage module composed of the first storage array group 1000 and the second storage array group 2000 is rectangular, and the pins 302 are located on one of the two shorter sides of the rectangle.

Figure 4:
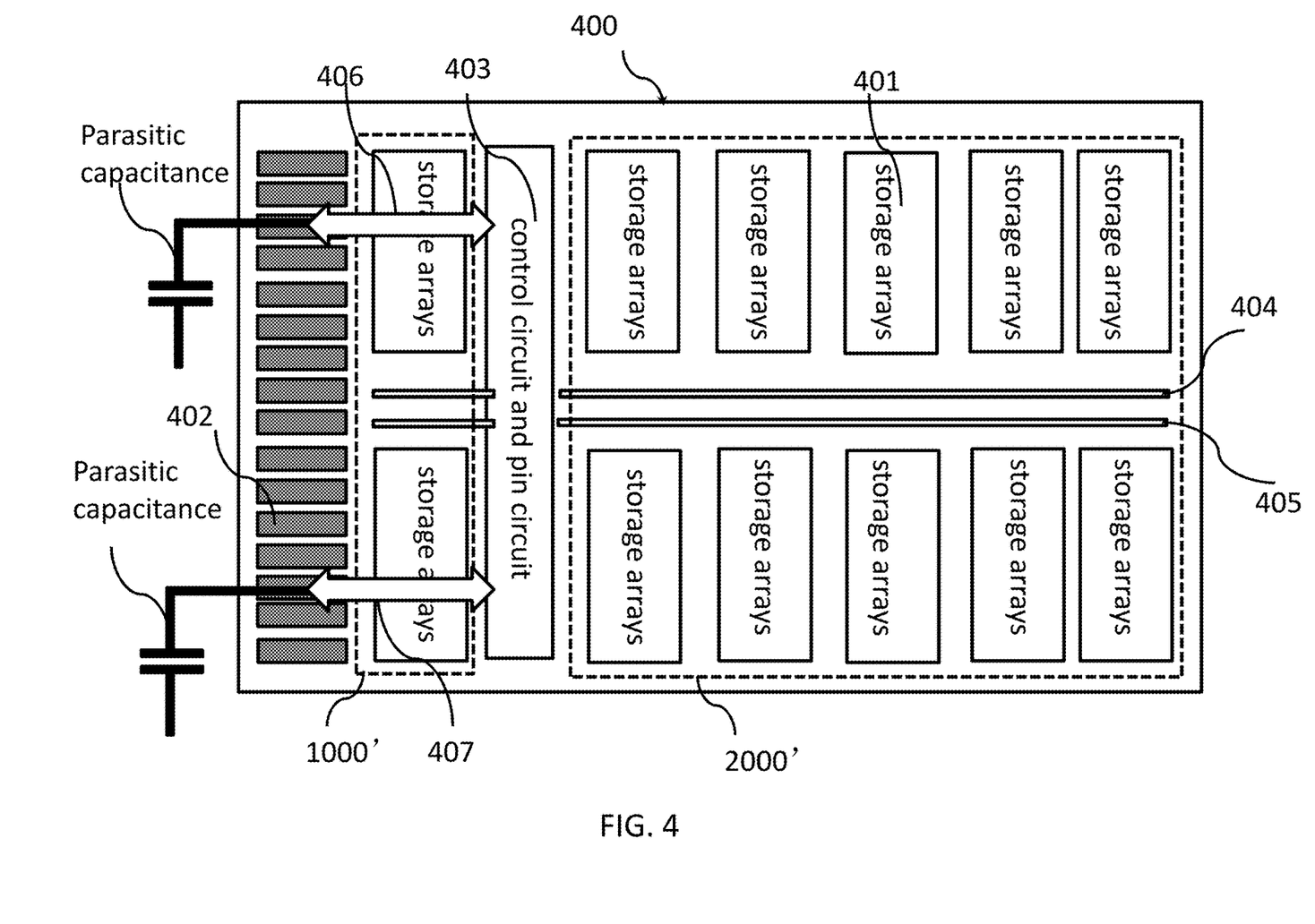
FIG. 4 is a schematic diagram of another chip layout according to an embodiment of the present disclosure.

FIG. 4 is the schematic diagram of the structural layout of the chip 400 according to an embodiment of the present disclosure.

As shown in FIG. 4, the chip 400 of the present disclosure includes a storage module (including a first storage array group 1000' and a second storage array group 2000', the first storage array group 1000' and the second storage array group 2000' respectively include multiple storage arrays 401), pins 402, control module 403 (control circuit and pin circuit), the second connection (command address bus 404 and data bus 405) and the first connection (command address connection line 406 and data connection line 407). Among them, the command address line 406 and the data line 407 both generate parasitic capacitance. In the embodiment shown in FIG. 4, the ratio of the numbers of storage arrays 401 of the first storage array group 1000' and the second storage array group 2000' is 1/5.

In the embodiment shown in FIG. 4, the first storage array group 1000' includes two storage arrays 401, and the second storage array group 2000' includes 10 storage arrays 401. However, the present invention is not limited to this ratio, the first storage array group 1000' may include storage arrays 401 other than two, and the second storage array group 2000' may include storage arrays other than ten.

Figure 5:
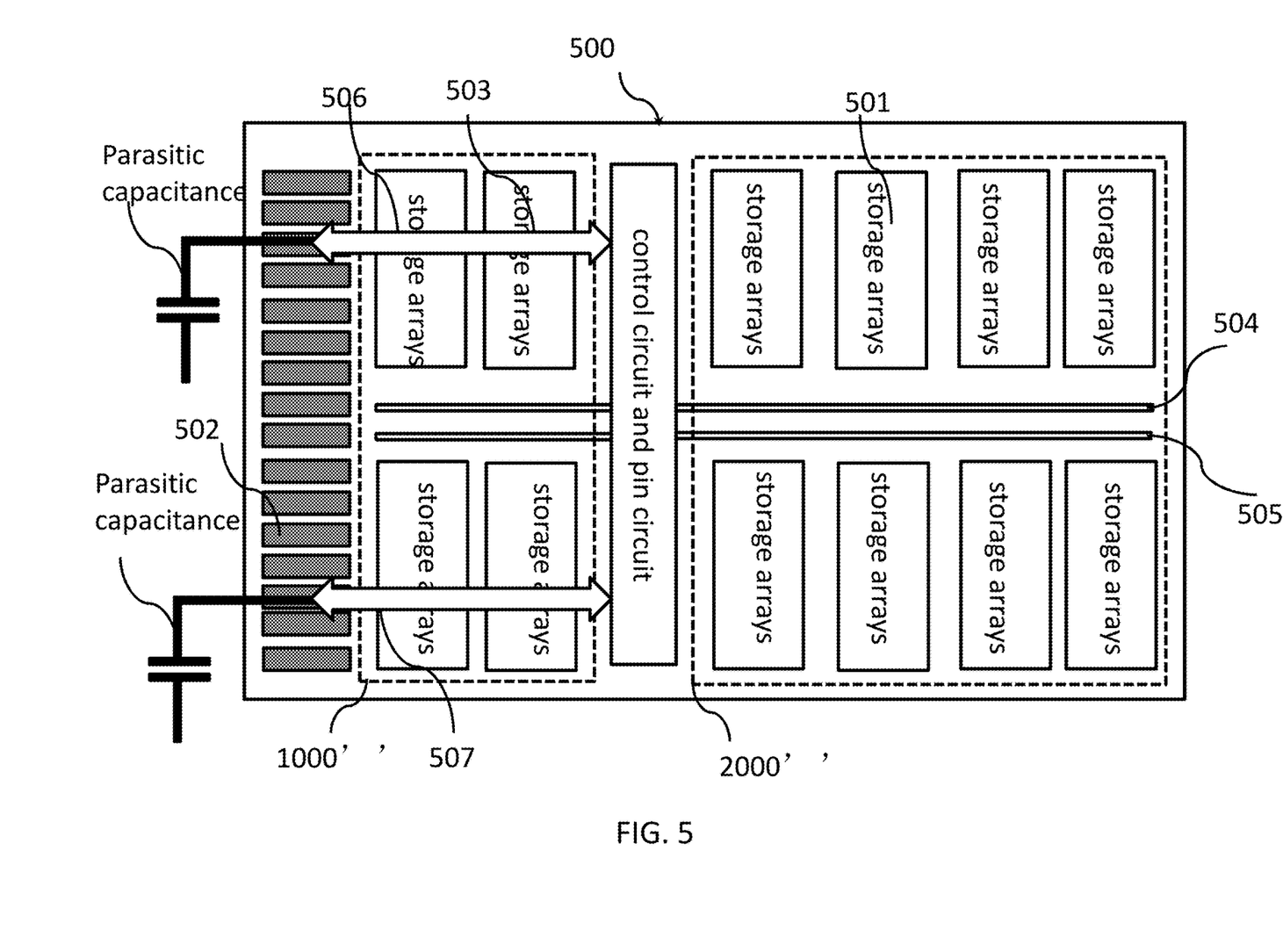
FIG. 5 is a schematic diagram of still another chip layout according to an embodiment of the present disclosure.

FIG. 5 is a schematic diagram of the structural layout of the chip 500 according to an embodiment of the present disclosure.

As shown in FIG. 5, the chip 500 of the present disclosure includes a storage module (including a first storage array group 1000" and a second storage array group 2000". The first storage array group 1000" and second storage array group 2000" each includes a plurality of storage arrays 501), pins 502, control modules 503 (control circuits and pin circuits), second connection (command address bus 504 and data bus 505), and first connection (Command address connection line 506 and data connection line 507). Among them, the command address line 506 and the data line 507 both generate parasitic capacitance. In the embodiment shown in FIG. 5, the ratio of the numbers of storage arrays 501 of the first storage array group 1000" and the second storage array group 2000" is 1/2.

In the embodiment shown in FIG. 5, the first storage array group 1000" includes 4 storage arrays 501, and the second storage array group 2000" includes 8 storage arrays. However, the present invention is not limited to this ratio, the first storage array in the group 1000" may include storage arrays 501 other than four, and the second storage array group 2000'' may include storage arrays 501 other than eight.

Figure 6:
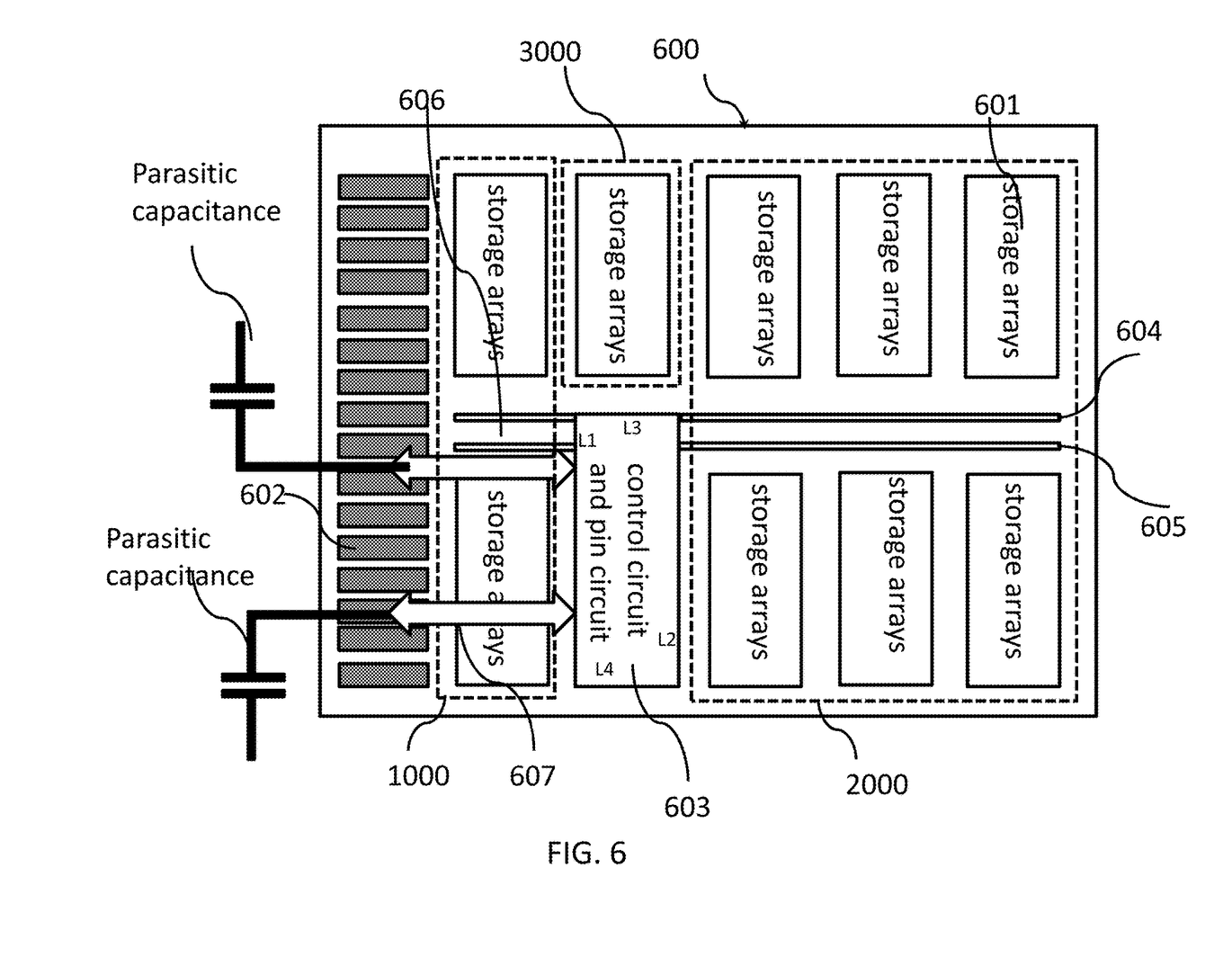
FIG. 6 is a schematic diagram of still another chip layout according to an embodiment of the present disclosure.

FIG. 6 is the schematic diagram of the structural layout of the chip 600 according to an embodiment of the present disclosure.

As shown in FIG. 6, the chip 600 of the present disclosure includes a storage module (including a first storage array group 1000, a second storage array group 2000, and a third storage module 3000. The first storage array group 1000, the second storage array group 2000, and the third storage module 3000 respectively include a plurality of storage arrays 601), pins 602, a control module 603 (control circuit and pin circuit), and a second connection (command address bus 604 and data bus 605), and the first connection (command address connection line 606 and data connection line 607). Among them, the command address line 606 and the data line 607 both generate parasitic capacitance. In the embodiment shown in FIG. 6, the number of storage arrays 601 of the first storage array group 1000 is less than the number of storage arrays 601 of the second storage array group 2000, and the number of storage arrays 601 of the third storage module 3000 is less than the number of storage arrays 601 in the second storage array group 2000.

In the embodiment shown in FIG. 6, the first storage array group 1000 includes two storage arrays 601, the second storage array group 2000 includes six storage arrays, and the third storage array group 3000 includes one storage array. However, the present invention is not limited to this, the first storage array group 1000 may include storage arrays 601 other than two, the second storage array group 2000 may include storage arrays other than six, and the third storage array group 3000 may include storage arrays other than one.

Continue referring to FIG. 6, the control circuit and pin circuit 603 includes a first side L1, a second side L2, a third side L3, and a fourth side L4. In FIG. 6, the third storage array group 3000 is located on the third side L3 of the control circuit and the pin circuit 603. In other embodiments, the third storage array group 3000 may be located on the fourth side L4 of the control circuit and the pin circuit 603 (not shown).

Figure 7:
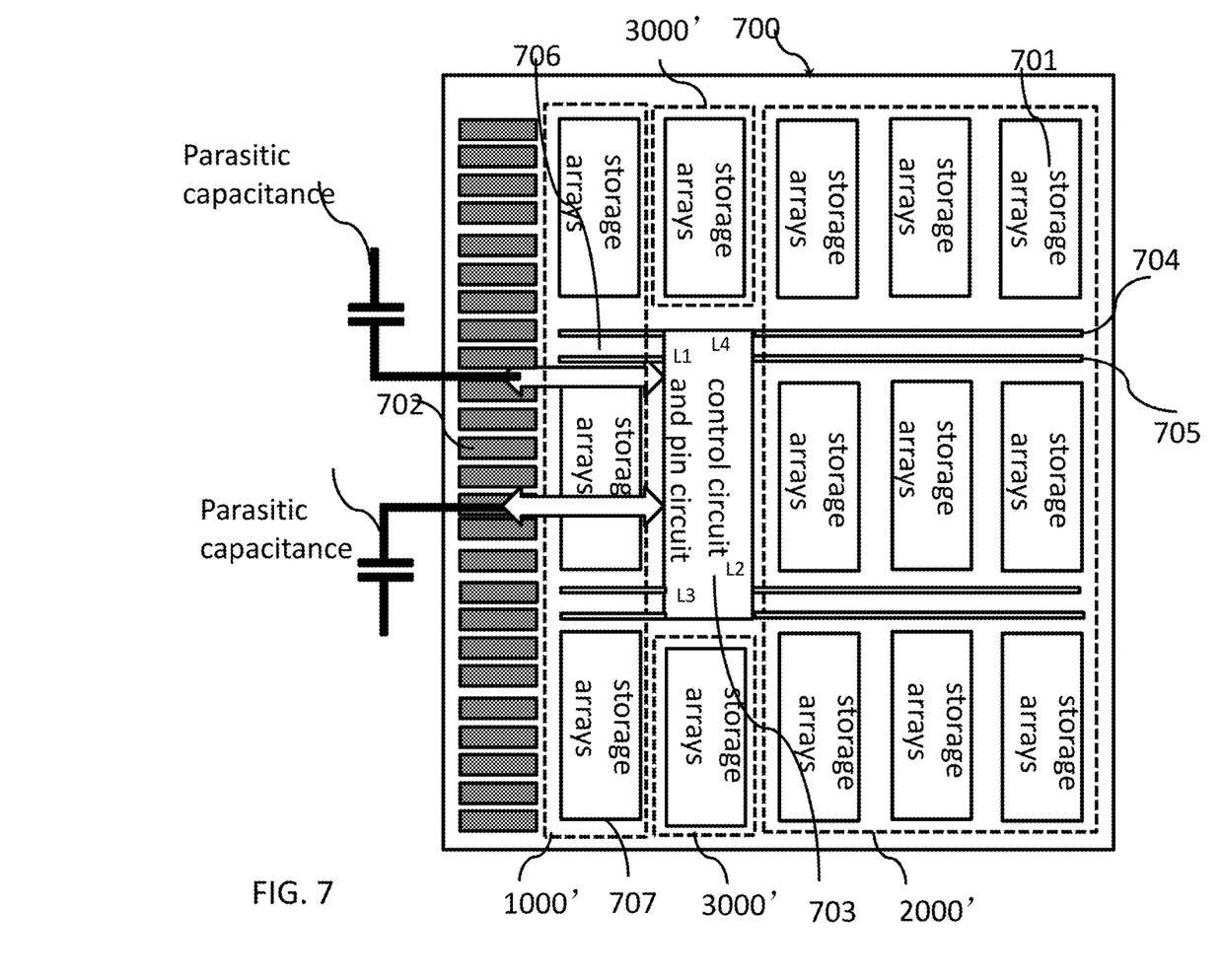
FIG. 7 is a schematic diagram of still another chip layout according to an embodiment of the present disclosure.

FIG. 7 is the schematic diagram of the structural layout of a chip 700 according to an embodiment of the present disclosure.

As shown in FIG. 7, chip 700 of the present disclosure includes storage module (including a first storage array group 1000', a second storage array group 2000', and a third storage array group 3000'. The first storage array group 1000', the second storage array group 2000' and the third storage array group 3000' respectively include a plurality of storage arrays 701), pins 702, a control module 703 (control circuit and pin circuit), and a second connection (command address bus 704 and data bus 705) and the first connection (command address connection line 706 and data connection line 707). Among them, the command address line 706 and the data line 707 both generate parasitic capacitance. In the embodiment shown in FIG. 7, the number of storage arrays 701 of the first storage array group 1000' is less than the number of storage arrays 701 of the second storage array group 2000', and the number of storage arrays 701 of the third storage array group 3000' is less than the number of storage arrays 701 of the second storage array group 2000'.

In the embodiment shown in FIG. 7, the first storage array group 1000' includes 3 storage arrays 601, the second storage array group 2000' includes 9 storage arrays, and the third storage array group 3000' includes 2 storage arrays. However, the present invention is not limited to these numbers, the first storage array group 1000' may include storage arrays 301 other than three, the second storage array group 2000' may include storage arrays other than nine, and the third storage array group 3000' may include storage arrays other than two.

Referring to FIG. 7, the control circuit and pin circuit 703 includes a first side L1, a second side L2, a third side L3, and a fourth side L4. In FIG. 7, the storage arrays 701 included in the third storage array group 3000' are respectively located on the third and fourth sides L4 of the control circuit and the pin circuit 703.

In one embodiment, the chip of the present disclosure is DRAM (Dynamic Random Access Memory).

The present disclosure also provides an electronic device, which includes any chips disclosed in the above embodiments.

In addition, the above-mentioned drawings are merely schematic illustrations of the processing included in the method according to the exemplary embodiments of the present invention, and are not intended for limitations. It is easy to understand that the processing shown in the above drawings does not indicate or limit the time sequence of these processings. In addition, it is easy to understand that these processes can be executed synchronously or asynchronously in multiple modules, for example.

After considering the specification and practicing the invention disclosed herein, those skilled in the art will easily think of other embodiments of the present application. This application intends to cover any variations, uses, or adaptive changes of the present invention. These variations, uses or adaptively changes following the general principles of the present invention and includes common knowledge or conventional technical means in the technical field not applied for by the present invention. The description and the embodiments are only regarded as exemplary, and the true scope and spirit of the present invention are pointed out by the claims.

It should be understood that the present invention is not limited to the detailed structure, drawings, or implementation methods that have been shown here. On the contrary, the present invention is intended to cover various modifications and equivalent arrangements included in the spirit and scope of the appended claims.

What is claimed is:

1. A chip comprising:
    a storage module, wherein the storage module comprises a first storage array group and a second storage array group, wherein the first storage array group comprises a plurality of first storage arrays and the second storage array group comprises a plurality of second storage arrays;
    pins located on a side of the first storage array group away from the second storage array group;
    a control module having four sides, wherein a first side and a second side are opposite to each other, a third side and a fourth side are opposite to each other, wherein the first storage array group is located at the first side and the second storage array group is located at the second side;
    a first connection electrically connecting the pins and the control module; and
    a second connection electrically connecting the control module with the first storage array group and the second storage array group;
    wherein storage arrays of the first storage array group and the second storage array group included in the storage module are evenly arranged;

wherein a ratio of a number of the plurality of first storage arrays in the first storage array group to a number of the plurality of second storage arrays in the second storage array group ranges from 1/5 to 1/3; and wherein a length of the first connection is less than a distance from the control module to a side of the second storage array group away from the control module.

2. The chip of claim 1, wherein the control module comprises a control circuit and a pin circuit.

3. The chip of claim 1, wherein the first connection comprises a command address line and a data line, and the second connection comprises a command address bus and a data bus.

4. The chip of claim 1, wherein the ratio of the number of the plurality of first storage arrays in the first storage array group to the number of the plurality of second storage arrays in the second storage array group is 1/3.

5. The chip of claim 1, wherein the ratio of the number of the plurality of first storage arrays in the first storage array group to the number of the plurality of second storage arrays in the second storage array group is 1/5.

6. The chip of claim 1, wherein the control module is located between two adjacent sides of the first storage array group and the second storage array group.

7. The chip of claim 1, wherein the storage module further comprises a third storage array group, wherein the third storage array group comprises a plurality of third storage arrays; and wherein, the plurality of third storage arrays in the third storage array group is located on the third side or the fourth side of the control module.

8. The chip of claim 1, wherein the first connection is a top-level wire, and wherein the first connection communicatively connects to the pins and to the control module.

9. The chip of claim 1, wherein the storage module is rectangular, and wherein the pins are located on one of two short sides of the rectangle.

10. An electronic device, characterized by comprising the chip according to claim 1.

11. A chip comprising:
a storage module, wherein the storage module comprises a first storage array group and a second storage array group, wherein the first storage array group comprises a plurality of first storage arrays and the second storage array group comprises a plurality of second storage arrays;
pins located on a side of the first storage array group away from the second storage array group;
a control module having four sides, wherein a first side and a second side are opposite to each other, a third side and a fourth side are opposite to each other, wherein the first storage array group is located at the first side and the second storage array group is located at the second side;
a first connection electrically connecting the pins and the control module; and
a second connection electrically connecting the control module with the first storage array group and the second storage array group;
wherein storage arrays of the first storage array group and the second storage array group included in the storage module are evenly arranged;
wherein a length of the first connection is less than a distance from the control module to a side of the second storage array group away from the control module;
wherein the storage module further comprises a third storage array group, wherein the third storage array group comprises a plurality of third storage arrays, and wherein, the plurality of third storage arrays in the third storage array group is located on the third side of the control module.

12. The chip of claim 11, wherein the storage module further comprises a fourth storage array group, wherein the fourth storage array group comprises a plurality of fourth storage arrays, and wherein the plurality of fourth storage arrays in the fourth storage array group is located on the fourth side of the control module.

* * * * *